(12) United States Patent
Jiang (10) Patent No.: US 7,983,052 B2
(45) Date of Patent: Jul. 19, 2011

(54) ELECTRONIC DEVICE CHASSIS AND NETWORK

(75) Inventor: Tao Jiang, Hangzhou (CN)

(73) Assignee: Hangzhou Huawei-3Com Technology Co., Ltd, Hangzhou, Zhejiang Province (CN)

(*) Notice: Subject to any disclaimer, the term of this patent is extended or adjusted under 35 U.S.C. 154(b) by 274 days.

(21) Appl. No.: 11/658,964

(22) PCT Filed: Jan. 26, 2006

(86) PCT No.: PCT/CN2006/000174
§ 371 (c)(1),
(2), (4) Date: Jan. 30, 2007

(87) PCT Pub. No.: WO2007/003083
PCT Pub. Date: Jan. 11, 2007

(65) Prior Publication Data
US 2009/0225521 A1    Sep. 10, 2009

(30) Foreign Application Priority Data

Jun. 30, 2005  (CN) .......................... 2005 2 0112542
Aug. 3, 2005   (CN) .......................... 2005 2 0103209

(51) Int. Cl.
*H05K 1/14* (2006.01)
(52) U.S. Cl. ......... 361/741; 361/756; 361/752; 361/638
(58) Field of Classification Search .............. 361/788, 361/741, 756, 638, 752
See application file for complete search history.

(56) References Cited

U.S. PATENT DOCUMENTS 4,017,770 A * 4/1977 Valfre ......................... 361/756
4,669,616 A * 6/1987 Mazura ....................... 211/41.17
4,688,148 A * 8/1987 Mallory et al. ............... 361/740
(Continued)

FOREIGN PATENT DOCUMENTS

CN           2657296 Y      11/2003
(Continued)

OTHER PUBLICATIONS

International Search Report from International Patent Application PCT/CN2006/000174.

(Continued)

*Primary Examiner* — Tuan T Dinh
*Assistant Examiner* — Steven Sawyer
(74) *Attorney, Agent, or Firm* — Wolf, Greenfield & Sacks, P.C.

(57) ABSTRACT

The invention relates to an electronic device chassis, comprising at least an opening on the chassis and an inward guide apparatus along the opening; the guide apparatus comprises at least a first guide part and a second guide part which are respectively a concave slide and a convex slide, to guide modules in at least two different structural specifications into the electronic device to establish electrical connection with the electronic device. The module is inserted through the opening along the slides, and is fitted to the corresponding connector on the mainboard. The invention can solve the problem that traditional switch devices can not support different transmission speeds and transmission modes between networks. With the slides, a device can be compatible with data transmission modules with different speeds and different interface forms. Functions of a device are enhanced and device configuration is increased; in addition, the structure is compact, which flexibly meets changing market demands for a device. The invention also relates to a network switch device with the chassis.

13 Claims, 7 Drawing Sheets

U.S. PATENT DOCUMENTS

| | | | | |
|---|---|---|---|---|
| 4,739,452 A | * | 4/1988 | Fukunaga | 361/756 |
| 5,316,488 A | * | 5/1994 | Gardner et al. | 439/79 |
| 5,387,132 A | * | 2/1995 | Sarver et al. | 439/633 |
| 5,872,701 A | * | 2/1999 | Hayden et al. | 361/786 |
| 6,285,564 B1 | * | 9/2001 | O'Brien | 361/801 |
| 6,821,141 B1 | * | 11/2004 | Liu | 439/377 |
| 6,980,437 B2 | * | 12/2005 | Bright | 361/704 |
| 7,210,586 B2 | * | 5/2007 | Ice | 211/26 |
| 2002/0006026 A1 | | 1/2002 | Takahashi et al. | |
| 2003/0047524 A1 | | 3/2003 | Sato et al. | |
| 2004/0252469 A1 | * | 12/2004 | Campbell et al. | 361/756 |

FOREIGN PATENT DOCUMENTS

| | | |
|---|---|---|
| CN | 2650453 Y | 10/2004 |
| CN | 2586301 | 11/2004 |
| DE | 201 05 293 U1 | 8/2001 |
| WO | WO 2004/017696 A1 | 2/2004 |

OTHER PUBLICATIONS

European Search Report for Application No. EP 06 70 5595 dated May 10, 2010.

\* cited by examiner

FIG. 12

ELECTRONIC DEVICE CHASSIS AND NETWORK

FIELD OF THE INVENTION

The invention relates to an electronic device chassis and a network switch device.

BACKGROUND OF THE INVENTION

As information network is constructed and efficiently managed, any network user can access the network to communicate and exchange information with other users. There are diverse important devices in the network. Ethernet switches are a category of important devices in communication network and provide line-speed forwarding function for a variety of Ethernet interfaces and accomplish data transmission and exchange in an internal network or an external network.

Figure 1A:
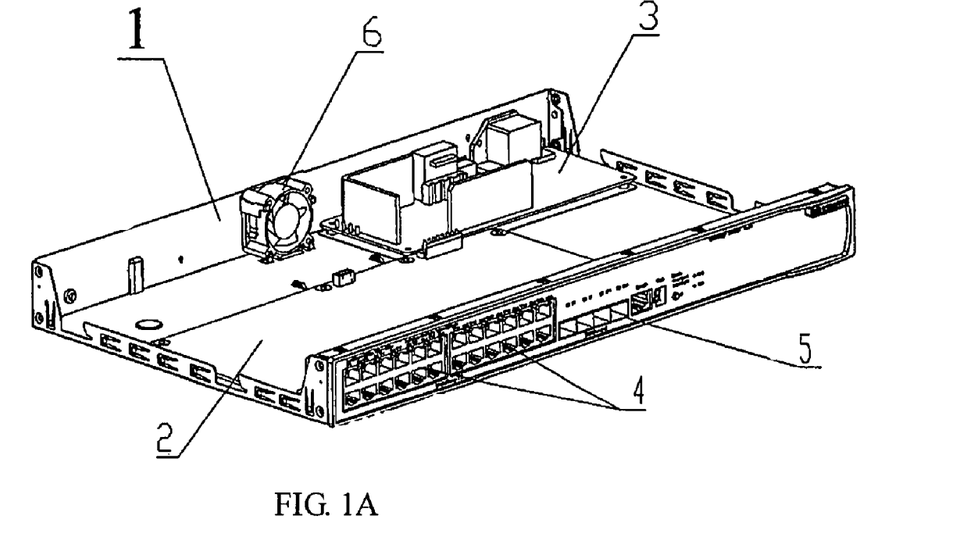
FIG. 1A and FIG. 1B are respectively a main view and a front view of internal structure of an Ethernet switch device in the prior art.
Figure 1B:
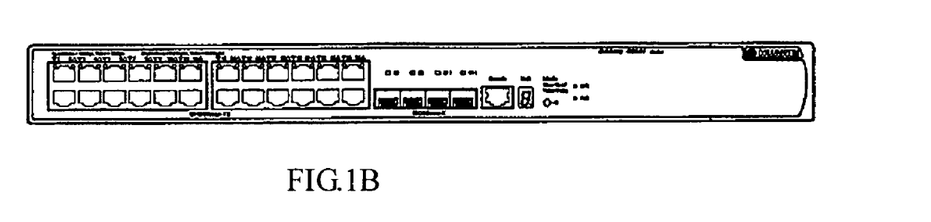

Referring to FIG. 1A, there is a top view of internal composition of an Ethernet switch, with the chassis cover removed. The Ethernet switch includes: chassis 1 (chassis cover removed), mainboard 2, power supply unit 3, and radiator fan 6 in the chassis. Connectors on mainboard 2 protrude from the openings on the front of the chassis. Wherein, the connectors include network port connector 4 (electrical port) and/or optical port connector 5 coupling with a higher speed link. Typically, the network port connector 4 usually serves as internal network switch ports in a LAN with lower speed, such as 10 Mbps or 100 Mbps, or up to 1,000 Mbps. As shown in FIG. 1A, there are 24 such internal network switch ports; in addition, the number of internal network switch ports can be increased to 48 by adding connectors, depending on the space in the chassis. The optical port connector 5 coupling with a higher speed link is usually used as an external network port for data transmission and exchange between the LANs and other networks or core networks. Since the optical port connector 5 providing an external transmission channel for the local network, the optical ports are usually high in speed and fewer in number. As shown in FIG. 1A, there are only four optical port connectors 5. A front view of the internal network ports (in lower speed) and external network ports (in higher speed) of an traditional Ethernet switch is shown in FIG. 1B. However, for traditional Ethernet switches, those external network ports cannot meet the demand of some users; for example, some users require 10 Gbps or above switch ports; however, the traditional Ethernet switch only support one type of external network port, i.e., optical port or high-speed network port.

It is seen from above analysis that the openings provided on the chassis of any traditional Ethernet switch can only match one type of external network port but cannot match external network ports in different physical packages or operated in different speeds. Therefore, the traditional Ethernet switches are simple in structure and can only provide data transmission at 10 Mbps to 1,000 Mbps transmission speed. Such a structure cannot flexibly support transmission speeds above 1,000 Mbps. At present, the Ethernet switch can provide up to 48 internal network switch ports and 2-4 external network ports in fixed speed or fixed physical package. Since the external network switch interfaces are in un-flexible forms at present, the switch device (e.g., Ethernet switch) has only one form of external network interface, i.e., optical port or high-speed network port in a single form. The optical port or high-speed network port cannot provide effective support and flexible configuration capability, specially for a variety of emerging 10 Gbps optical module interfaces.

SUMMARY OF THE INVENTION

According to an embodiment of the present invention, there is provided an electronic device chassis and a network switch device, so as to solve the problem that the traditional switch devices can not support different switch module interfaces.

According to an embodiment of the present invention, there is provided an electronic device chassis, including at least an opening on the chassis and an inward guide apparatus along the opening; wherein the guide apparatus comprises at least a first guide part and a second guide part for respectively guiding one of interface modules in different structural specifications into the electronic device to establish electrical connection with the electronic device.

According to an embodiment of the present invention, there is also provided an Ethernet switch, including: at least a port disposed on a front wall of a chassis of the switch, which are electrically connected to at least a front interface of a circuit board of the Ethernet switch; a slot arranged on a rear wall of the Ethernet switch for receiving a first optical module or a second optical module to electrically connect to a rear interface of a circuit board, the first and second optical module being configured in different physical package; a slide apparatus arranged in the slot comprising a concave slide and a convex slide for respectively guiding the first optical module and the second optical module to the circuit board.

According to an embodiment of the present invention, there is also provided a network device including a module receiving apparatus for receiving at least a first interface module and a second interface module, the first and second interface modules having different structural specifications.

The advantages of the invention will be introduced in the following detailed description according to the preferred embodiments with the accompanying drawings.

DETAILED DESCRIPTION OF THE EMBODIMENTS

Hereunder the electronic device according to the embodiments of the invention is described with an Ethernet switch as an example.

According to embodiments of the present invention, there is provided support for a variety of interfaces in the structure of a switch device. In an embodiment of the invention, at least an opening is arranged on the chassis. A guide apparatus is provided in the chassis, corresponding to the opening. The guide apparatus includes a bracket and slides; the slides are fixed to the bracket. At least a connector for matching an interface module (in this embodiment, the module includes high-speed external network ports or other similar ports, it is the same below and will not be described again) is arranged on the mainboard of the device chassis.

The interface module, for example, a 10 Gigabit Small Form Factor Pluggable (XFP) module board, a stacked module board, a 10 Gigabit Ethernet Transceiver Package (XENPAK) module, or an other similar module, is connected to a female connector on the mainboard via the slide through the chassis opening in order to effectively support different module, and thereby enhance function of the switch device; in addition, the structure is compact and thereby makes the switch device adaptive to the rapidly changing network and market demands.

It is understood that the opening in the invention can be arranged on any chassis wall (e.g., on a side wall, or on the front wall if there is enough space), depending on the space in the chassis; for existing switches, it is preferred to arrange the opening on the rear wall, because there are several low speed internal ports and medium or high speed external network ports on the front wall and there is no enough space to arrange other high speed external network ports (e.g., a 10 G port). Furthermore, the high speed external network port is large in size. Whether the port can rapidly match the connector on the mainboard has to be considered in the design of the high speed external network port. There are some considerations that why the port is arranged on the rear wall of the chassis in this embodiment. Viewed from the structure of any existing Ethernet switch, the mainboard is closer to the front wall of the chassis so as to fit tightly with the existing internal and external network ports. Though the other side of the mainboard (the side near the rear wall of the chassis) is a little bit farther from the rear wall of the chassis, the distance between the rear wall and the mainboard can be utilized in this embodiment to mount slides and bracket in the chassis, so that the high speed external network port with larger size can be fitted to the corresponding connector on the mainboard quickly and safely, and can support rapid pluggable form.

According to embodiments of the invention, the electronic device chassis at least includes: at least an opening on the chassis and an inward guide apparatus along the opening; the guide apparatus includes at least the first guide part and the second guide part, to guide modules in at least two different structural specifications into the electronic device to establish electrical connection with the electronic device. The guide apparatus further includes: a bracket designed to support the first guide part and the second guide part. The first guide part is a concave slide; the second guide part is a convex slide; and the concave slide and the convex slide share the same side wall; or, both of the first guide part and the second guide part both are concave slides or convex slides.

Hereunder the invention is further described with reference to the attached drawings, with an Ethernet switch as the example.

Figure 2A:
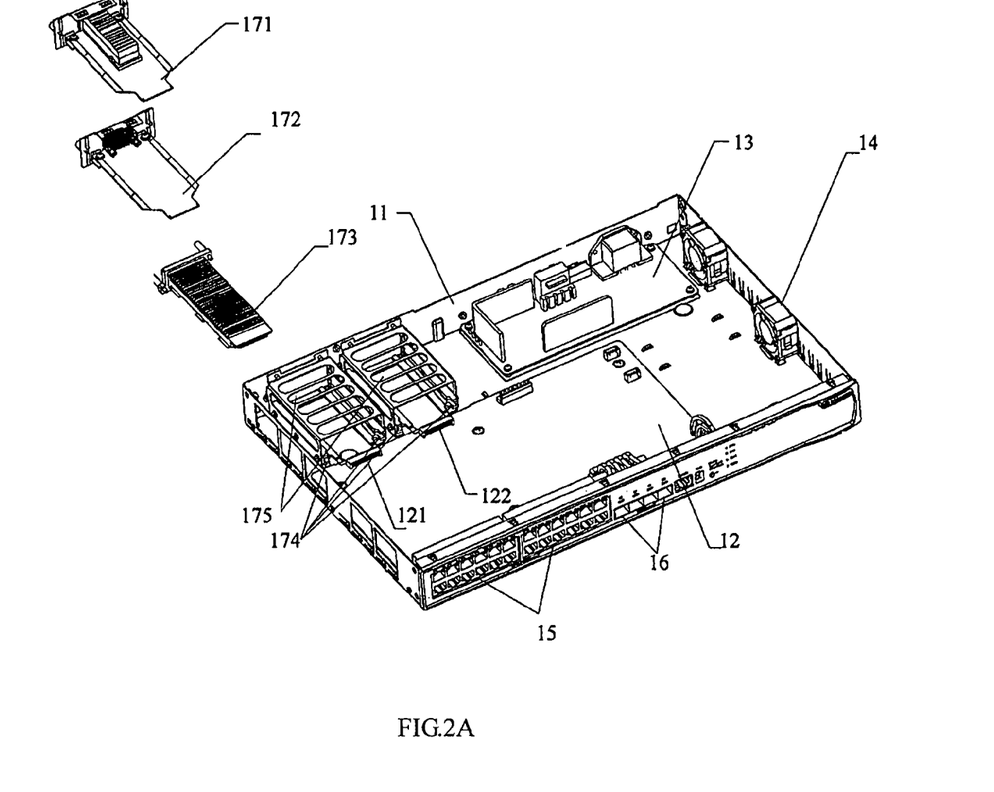
FIG. 2A and FIG. 2B are respectively a main view and a rear view of internal structure of the Ethernet switch described in the invention.
Figure 2B:
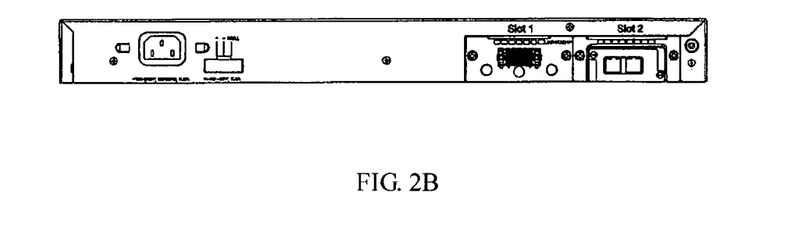

Referring to FIG. 2A and FIG. 2B, there are respectively a schematic diagram of internal structure and rear view of an Ethernet switch in a preferred embodiment of the invention. Suppose there are two openings on the rear wall of the chassis, however, the number of openings is not limited to two; one or three, etc., are permitted, depending on the space in the chassis. The internal structure shown in FIG. 2A includes: two openings (not shown) on the rear wall of chassis 11, two connectors 121 and 122 on the mainboard 12 in the chassis, power supply unit 13, fan 14, a plurality of low or medium speed ordinary internal ports 15 and several high speed external network ports 16 on the front wall of the chassis, and at least a high speed external network port on the chassis (herein, there are two external network ports), and the high speed external network port can be fitted to connector 121 and/or connector 122. The high speed external network port includes a 10 G XFP module interface card 171 and/or a 10 G stacked module interface card 172 and/or a standard 10 G XENPAK module 173. At least a pair of slides 174 (including concave slide and convex slide) for installing the high-speed external network port and bracket 175 supporting the slides. The module is inserted through the opening on the chassis along the slides, and is fitted to the connector on the mainboard. Different 10 G modules can be inserted through at least one opening (there are 2 openings in the embodiment of the invention) on the chassis in any combination, and are fitted to the corresponding connector 121 and connector 122, so as to accomplish hardware connections of the 10 G modules; with those 10 G module interfaces, the device can perform external data exchange and transmission in different interface forms at 10 G speed. The rear view of the Ethernet switch in the invention is shown in FIG. 2B.

Figure 3:
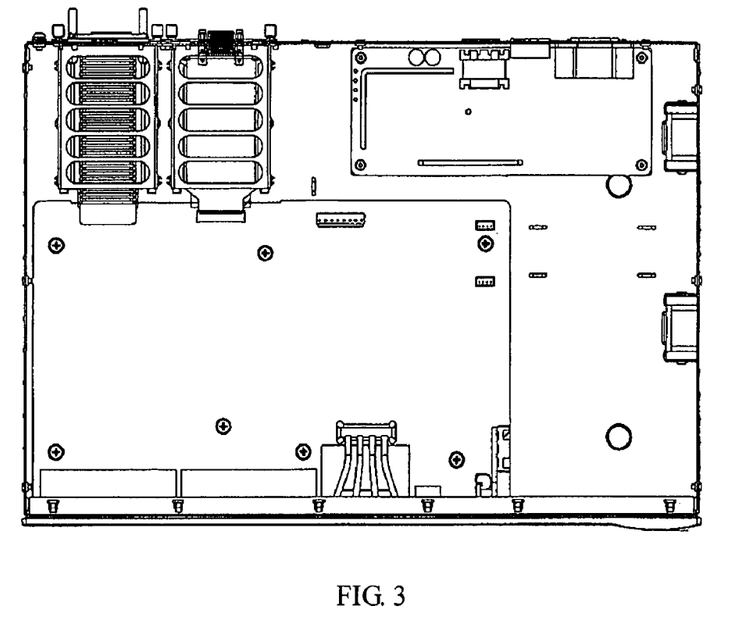
FIG. 3 is a schematic diagram of internal structure of an embodiment of the invention, with the 10 G module installed.

Referring to FIG. 3, there is a schematic diagram of the invention, with the 10 G modules installed. Though the invention is shown with two pairs of brackets and two pairs of slides, the invention is not limited to such an arrangement; for example, one pair of brackets and slides, two pairs of brackets and two slides, or multiple brackets and slides are permitted, depending on the space in the chassis and specific demands of users. Corresponding connectors shall be provided on the mainboard, in order to connect the high speed external network interfaces to the mainboard. The installation process is: inserting any two modules or interface cards of the 10 G XFP module interface card, 10 G stacked module interface card, or standard 10 G XENPAK module into the chassis through the openings, and connecting them quickly and stably to the corresponding connectors on the mainboard along the slides, to implement data transmission and exchange between the local network and other networks or core networks, so that the Ethernet switch structure described in the invention can support more high speed external network ports.

Wherein, the slides and the brackets supporting the slides in the invention are designed to facilitate plugging/pulling of the high speed external network ports (e.g., 10 G modules) in rear part of the chassis. With the slides designed in the invention, the 10 G modules required by the user can be inserted quickly and stably through the openings and accomplish the hardware connection with the connectors on the mainboard via the slides.

Figure 4:
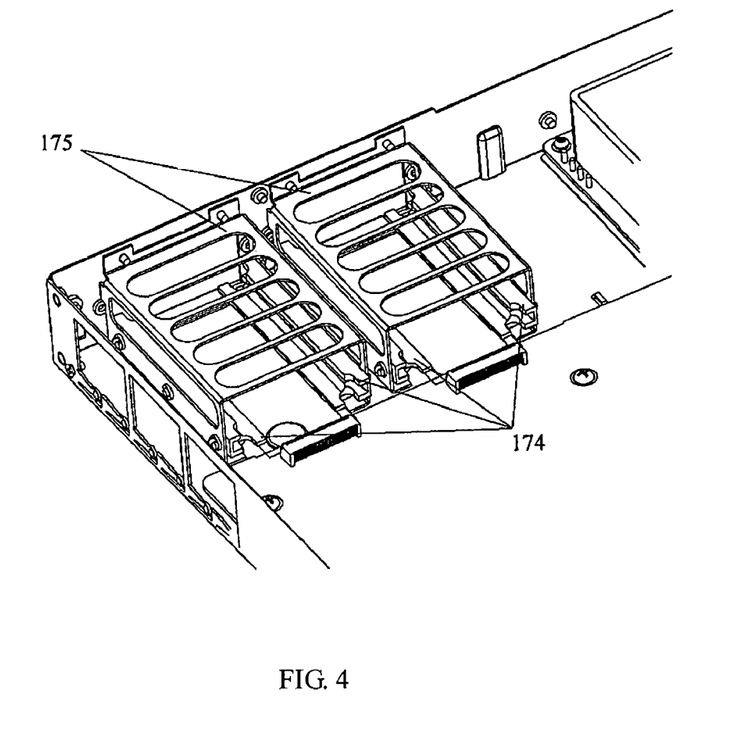
FIG. 4 is a structural representation of the guide apparatus in the invention.
Figure 5:
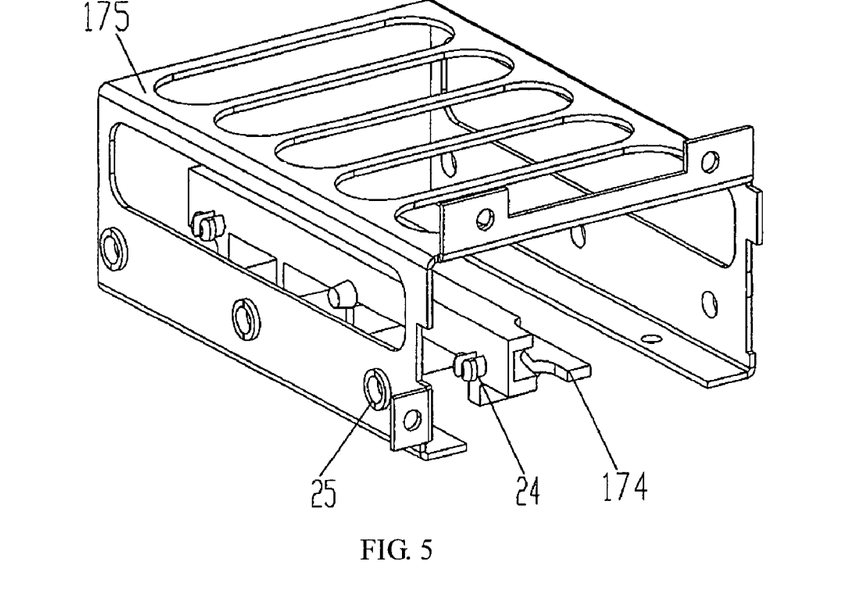
FIG. 5 is a structural representation of an embodiment of the invention in which the slides are fixed to the bracket by clipping.

Referring to FIG. 4 and FIG. 5, FIG. 4 is a structural diagram of the guide apparatus (slides and brackets supporting the slides) in the invention. The guide apparatus includes slides 174 and brackets 175 supporting the slides. The brackets are in frame, rectangular, or semi-cylindrical shape, with at least a horizontal side. In addition, the two side arms connected to the horizontal side are used to fix the slide. The shape of the horizontal side can be determined depending on the space in the chassis. Furthermore, there are heat dissipation holes in any shape (e.g., round, elliptical or rectangular shape) in the brackets, which will not be described individually. Hereunder the invention is described with two slides and two brackets as an example, to explain the method with which the slides are fixed to the brackets. The method that the slides are fixed to the brackets by clipping is shown in FIG. 5, as follows: inserting the resilient clip structure 24 on the slide 174 into the hole 25 in the bracket 175. Finally, the required two 10 G modules or interface cards are inserted in the chassis through the openings and is fitted to the corresponding connectors on the mainboard quickly and stably via the slides according to requirements of a user.

In addition, the slides can also be fixed to the brackets by arranging at least two positioning holes in the brackets corresponding to the two slides, and respectively fixing the slides to corresponding brackets with positioning studs through the positioning holes (not shown). The positioning holes are screwthread holes or through holes. The positioning studs are screw studs matching the screwthread holes or smooth rods matching the through holes. However, the invention is not limited to fixing the slides to the brackets with positioning studs through positioning holes. Next, the slide and bracket assemblies are fixed to the chassis as follows: arranging at least two positioning holes on the brackets, respectively, arranging positioning holes on one side of the chassis corresponding to the positioning holes on the bracket, and fixing the two brackets with slides to the chassis with positioning studs through the positioning holes. Respectively, the required two 10 G modules or interface cards can be inserted into the chassis through the openings and connected to the corresponding connectors on the mainboard quickly and stably via the slides according to requirements of a user.

Figure 6:
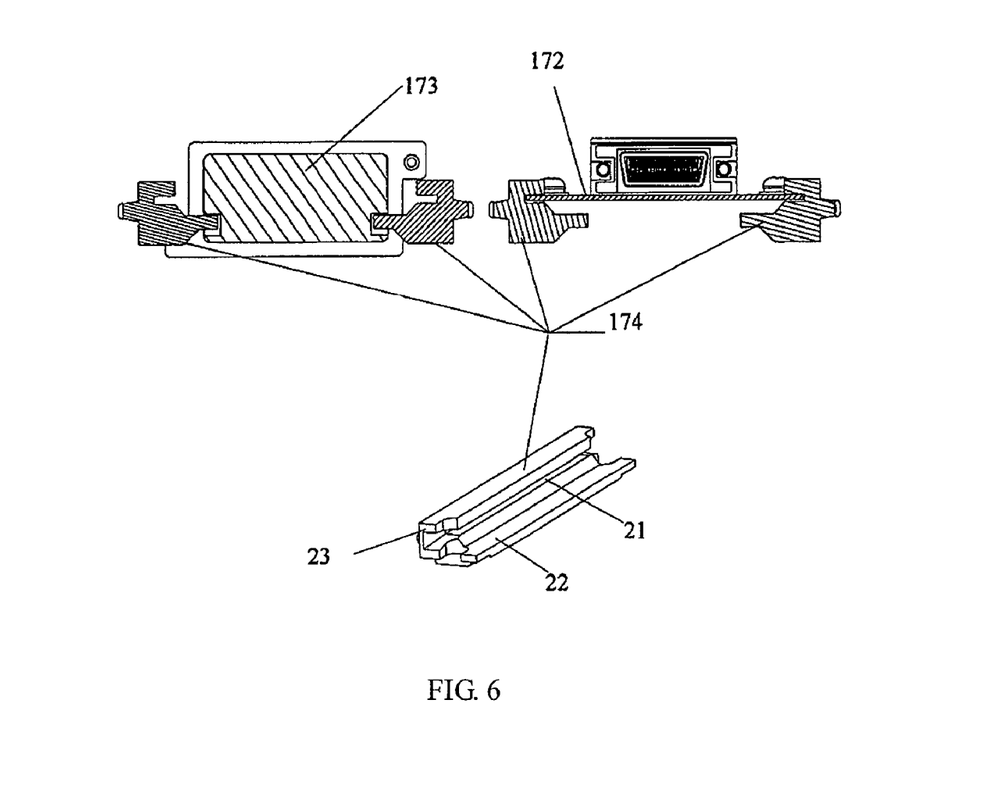
FIG. 6 is a structural representation of the slides in the Ethernet switch structure in the invention.

Referring to FIG. 6, there is a structural representation of the slides in the Ethernet switch structure in the invention. As shown in FIG. 6, there are the following parts: a slide 174, an XENPAK module 173, an XFP module board or stacked module board 172, a concave slide 21, and a convex slide 22. The slide 174 is a multi-functional slide, including convex slide 22 and concave slide 21; the convex slide 22 and the concave slide 21 share the same side wall 23, which can be used to fix the slides. In addition, since the XENPAK module is a commercial module with concave notches, it must be used in conjunction with convex slides; other modules mentioned in the invention (e.g., XFP or stacked module board or other similar modules) are in single board form and therefore must be used in conjunction with concave slides.

Practically, the first and second guide parts of the guide apparatus in the invention can be a concave slide and a convex slide, or two concave slides or two convex slides, or, multiple concave or convex guide parts can be provided on the guide apparatus as required, the principle thereof is the same as above, and will not be described again.

Figure 7:
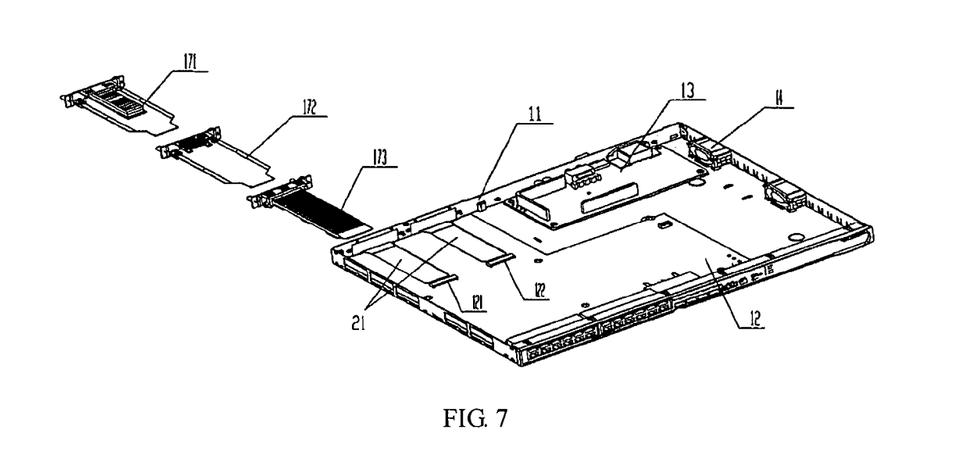
FIG. 7 is the main view of another internal structure of the Ethernet switch in the invention.
Figure 8:
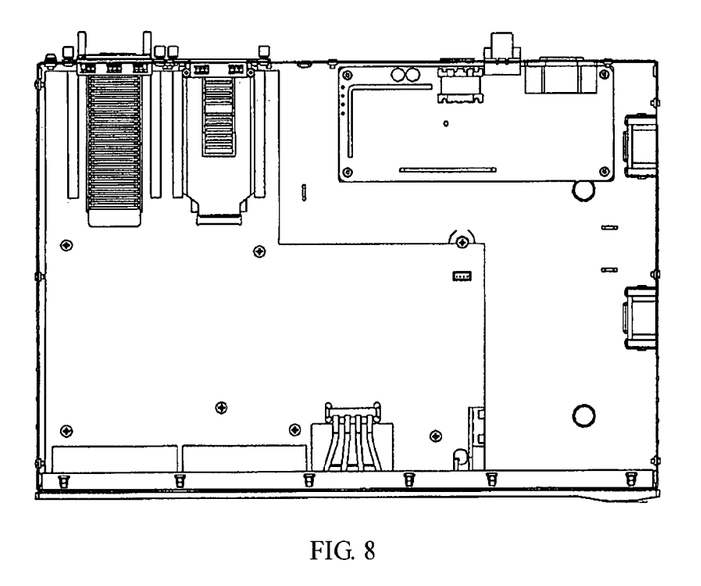
FIG. 8 is a schematic diagram of another internal structure of an embodiment of the invention, with the 10 G module installed.

In addition, in another embodiment according to the invention, another guide apparatus is also designed to facilitate plugging and pulling the 10 G modules through the openings in the invention, as shown in FIG. 7. FIG. 7 is a main view of another type of internal structure of the Ethernet switch in the invention. As shown in FIG. 7, the part of the internal structure of the Ethernet switch identical to that shown in FIG. 2A will not be described further here. Now, the difference is mainly described. A U-shaped opening (not shown) is provided on the mainboard of the Ethernet switch, corresponding to the opening; the edge of the U-shaped opening is used as the first guide part of the guide apparatus, i.e., the edge of the U-shaped opening is used as a protrusion; in addition, a pair of concave slides (made of any material, such as metal or thermoplastics, etc.) is added on the mainboard; the concave slides can be fixed to the mainboard by clipping, welding, or screwing, etc. The slides have guide function, so that the modules or module boards can be fitted to the connectors on the mainboard quickly and accurately. A schematic diagram of mounting the modules or module boards into the chassis in the invention is shown in FIG. 8.

Figure 9:
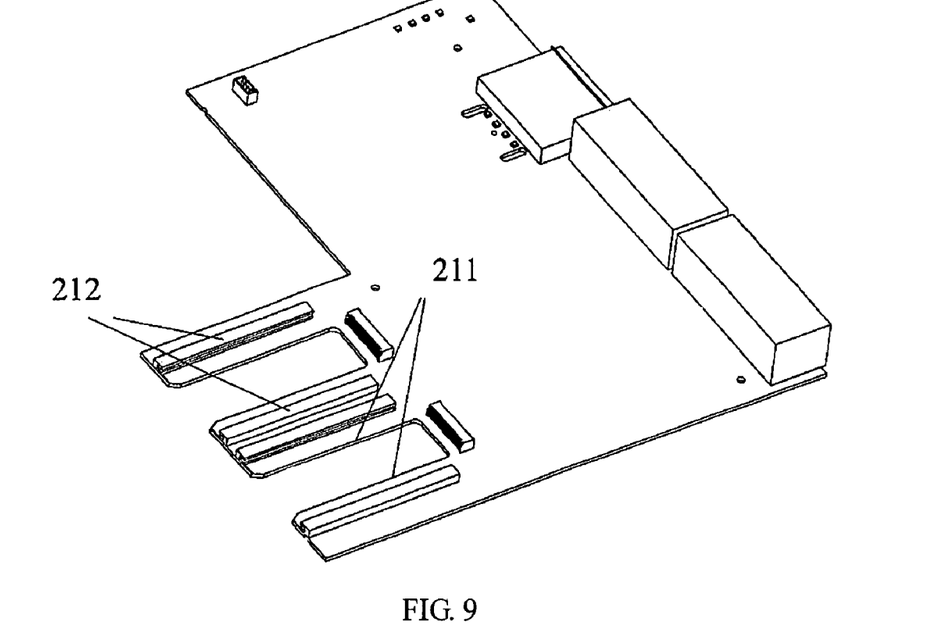
FIG. 9 is a schematic diagram of the mainboard with slides in the invention.
Figure 10:
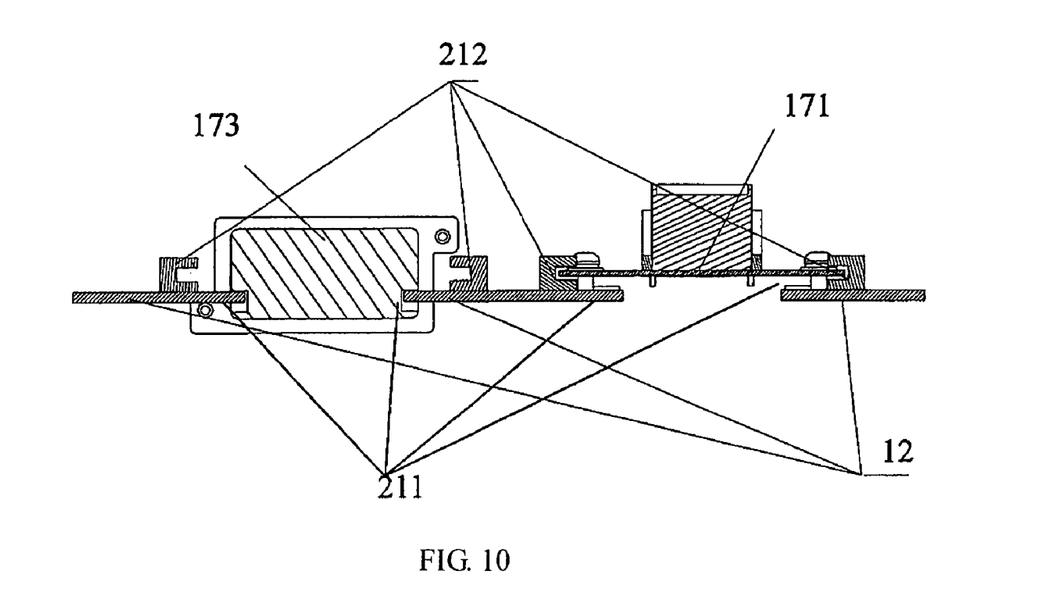
FIG. 10 is a schematic diagram of the compatible dual slides with which the module is mounted to the guide apparatus in the invention.

Referring to FIG. 9 and FIG. 10, there are a schematic diagram of a mainboard with slides in the invention and a schematic diagram of mounting the module to the compatible dual slides on the guide apparatus. As shown in FIG. 9, the guide apparatus on the mainboard includes at least the first guide part and the second guide part. There is an inward U-shaped opening on the edge of the mainboard. The first guide part includes at least a pair of convex slides 211 formed by two opposite edges of the U-shaped opening. The second guide part includes at least a pair of concave slides 212. The concave slides 212 are mounted to the mainboard by clipping, welding, or screwing. The convex slides 211 and the concave slides 212 form compatible dual slides. The modules can be mounted to the connectors on the mainboard via the slides quickly and accurately. The method for mounting the modules into the slides is shown in FIG. 10. The FXP module interface card (or stacked module interface card) 171 is inserted into the concave slides 212 on the mainboard. The XENPAK module 173 is inserted in the U shape on the mainboard. The edges of the U shape are the convex slides 211.

Figure 11:
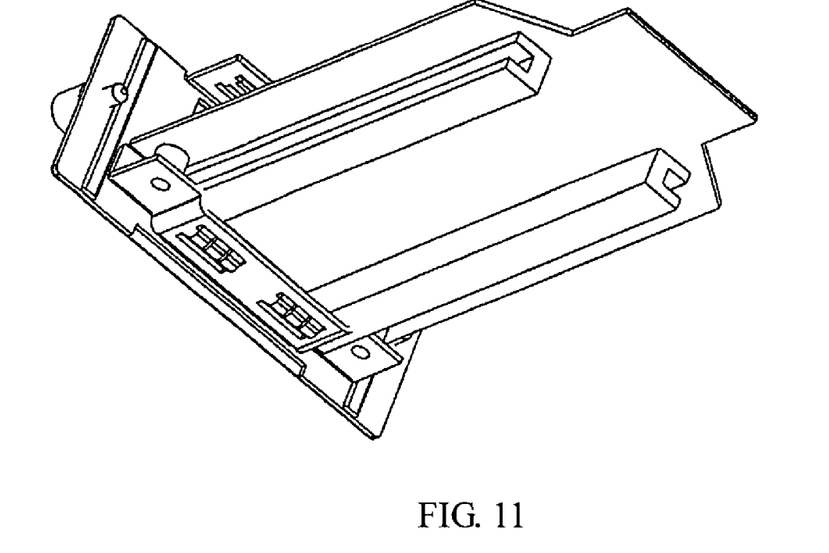
FIG. 11 is a structural representation of another guide apparatus mounted to the module board in the invention.
Figure 12:
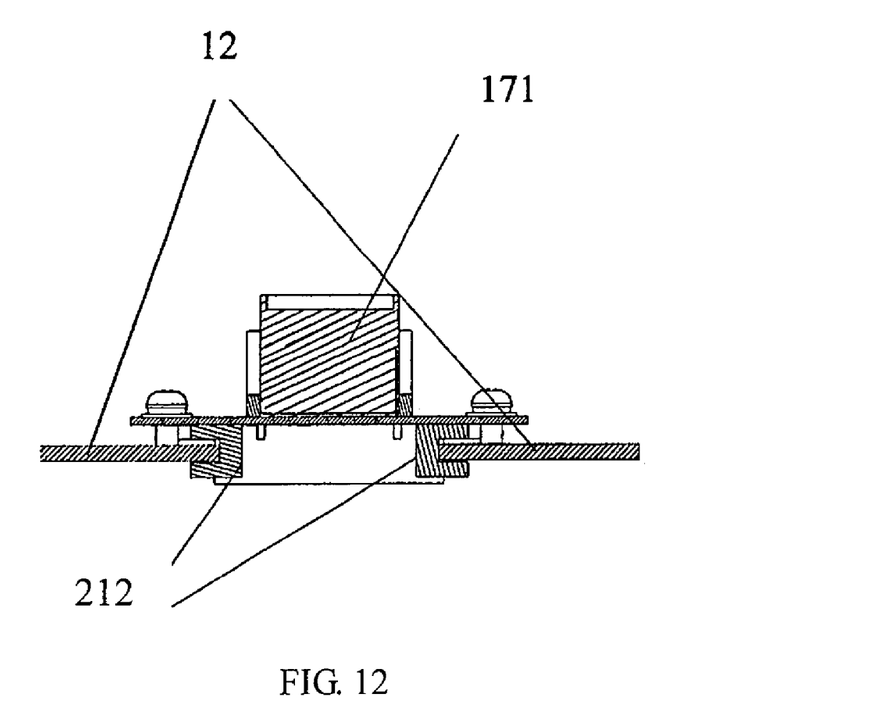
FIG. 12 is a schematic diagram of fitting the module board mounted with concave slides to the mainboard in the invention.

Of course, the concave slides described in the invention can be mounted on a mainboard or other module boards. As shown in FIG. 11, there is a schematic diagram of a module board with slides in the invention. The module board includes at least a pair of concave slides, which can be fixed to the module board by clipping, welding, or screwing, and the notches of the concave slides are in the same direction as the edges of the module board, to facilitate quick plugging/pulling of the module. Referring to FIG. 12, there is a schematic diagram of fitting the module board with concave slides to the mainboard. As shown in FIG. 12, the module is, the concave slides 212 on the XFP module interface card (or stacked module board) 171 are fitted to the notched edge of mainboard 12. In this way, the user can plug/pull a standard module conveniently and quickly.

Furthermore, in practical application of the invention, if a user does not need any high speed external network port (e.g., a 10 G module), the openings on the chassis can be sealed with panels; thus, the chassis is identical to a traditional electronic device chassis.

Furthermore, the invention can also be implemented as follows: a network device including a slot into which interface modules in at least two different structural specifications can be plugged.

The slot has slides to guide the interface module to fit to it. The slides can be implemented in the same way as above, and will not be described further here.

Though the invention is described in preferred embodiments as above, it is noted that those skilled in the art can make various improvements or modifications to the embodiments without departing from the principle of the invention. Those improvements or modifications shall also fall in the protected domain of the invention.

The invention claimed is:

1. An electronic device chassis, comprising two side walls, a front wall and a rear wall perpendicular to the side wall, wherein lower speed network ports are provided on the front wall, a circuit board is provided in the chassis to extend between the front wall and the rear wall, wherein front interfaces are provided on a front end of the circuit board and electrically connected to the lower speed network ports, and at least a rear interface is provided on a rear end of the circuit board, at least an opening is provided on the rear wall and a guide apparatus is arranged substantially parallel to the side walls to extend from the opening towards the front wall; wherein, the guide apparatus comprises a pair of concave slides for guiding a module with convex guide rails into the electronic device to electrically connect to the rear interface of the circuit board and a pair of convex slides for guiding a module with concave guide rails into the electronic device to electrically connect to the rear interface which is the same as the rear interface connected to the module with convex guide rails; wherein, a lower portion of the concave slide extends towards the center of the opening to form the convex slide.

2. The electronic device chassis of claim 1, wherein the guide apparatus further comprises a bracket which supports the concave slide and the convex slide.

3. The electronic device chassis of claim 1, wherein the convex slides are formed by two opposite edges of an U-shaped opening formed on the mainboard or module board in the chassis of the electronic device; the concave slides are mounted on two opposite edges of the U-shaped opening.

4. The electronic device chassis of claim 1, wherein the electronic device chassis is a chassis for an Ethernet switch device, the module which is guided by the guide apparatus comprises a 10 Gigabit Small Form Factor Pluggable (XFP) module interface card, a stacked module interface card, or a 10 Gigabit Ethernet Transceiver Package (XENPAK) module.

5. The electronic device chassis of claim 3, wherein the concave slide and the convex slide are fixed to the bracket by clipping.

6. The electronic device chassis of claim 2, wherein the bracket is fixed in the chassis by riveting, welding, or screwing.

7. The electronic device chassis of claim 3, wherein the concave slides are mounted onto the mainboard or module board in the chassis of the electronic device by clipping, welding, or screwing.

8. The electronic device chassis of claim 5, wherein the bracket is in frame or rectangular shape, with heat dissipation holes.

9. An Ethernet switch, comprising:
a circuit board provided in the switch to extend between a front wall of a chassis of the switch and a rear wall of the chassis of the switch, wherein front interfaces are provided on a front end of the circuit board and electrically connected to lower speed network ports, at least one rear interface is provided on a rear end of the circuit board, and lower speed network ports are disposed on the front wall of the chassis of the switch, which are electrically connected to at least a front interface of the circuit board of the Ethernet switch;
a slot arranged on the rear wall of the Ethernet switch for receiving a first optical module or a second optical module to electrically connect to the same rear interface of a circuit board, the first and second optical module being configured in a different physical package;
a slide apparatus arranged substantially parallel to the side walls to extend from the slot towards the front wall, comprising a pair of concave slides for guiding the first optical module with convex guide rails to the circuit board and a pair of convex slides for guiding the second optical module with concave guide rails to the circuit board; wherein the convex slides are formed by two opposite edges of a U-shaped opening of the circuit board on which the concave slides are fixed.

10. The Ethernet switch of claim 9, wherein the distance between an opening of the slot and the rear interface is farther than the distance between the port on the front wall and the corresponding front interface.

11. The Ethernet switch of claim 9, wherein the first and second optical modules are operated at the same speed which is higher than the operating speed of the ports on the front wall.

12. The Ethernet switch of claim 9, further comprising a bracket on which the slide apparatus is mounted, the bracket comprising a plurality of heat dissipation holes.

13. The Ethernet switch of claim 11, wherein the first and second optical modules are operated at 10 Gbps or above.

* * * * *

UNITED STATES PATENT AND TRADEMARK OFFICE
CERTIFICATE OF CORRECTION

| | | |
|---|---|---|
| PATENT NO. | : 7,983,052 B2 | Page 1 of 1 |
| APPLICATION NO. | : 11/658964 | |
| DATED | : July 19, 2011 | |
| INVENTOR(S) | : Tao Jiang | |

It is certified that error appears in the above-identified patent and that said Letters Patent is hereby corrected as shown below:

Title Page Item (54) & Col. 1
Title of the invention should read:
ELECTRONIC DEVICE CHASSIS AND NETWORK SWITCH DEVICE Signed and Sealed this
Fourth Day of October, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,983,052 B2 | Page 1 of 1 |
| APPLICATION NO. | : 11/658964 | |
| DATED | : July 19, 2011 | |
| INVENTOR(S) | : Tao Jiang | |

It is certified that error appears in the above-identified patent and that said Letters Patent is hereby corrected as shown below:

In column 7, line 36, in Claim 5, delete "claim 3," and insert -- claim 2, --, therefor.

Signed and Sealed this
Twenty-eighth Day of February, 2012

David J. Kappos
*Director of the United States Patent and Trademark Office*